United States Patent [19]

Yamazaki et al.

[11] Patent Number: 5,105,169

[45] Date of Patent: Apr. 14, 1992

[54] CURRENT CONTROLLED OSCILLATOR INCLUDING CONVERSION OF CONTROL VOLTAGE TO REGULAR AND THRESHOLDED CONTROL CURRENTS

[75] Inventors: Kiyohiko Yamazaki; Kazushige Yamamoto, both of Tokyo, Japan

[73] Assignee: Oki Electric Industry Co., Ltd., Tokyo, Japan

[21] Appl. No.: 654,239

[22] Filed: Feb. 12, 1991

[30] Foreign Application Priority Data

Feb. 13, 1990 [JP] Japan .................................. 2-32115

[51] Int. Cl.⁵ .......................... H03B 5/24; H03L 7/107
[52] U.S. Cl. ........................................ 331/34; 331/111;
331/177 R; 331/17
[58] Field of Search ................ 331/34, 111, 177 R, 331/17

[56] References Cited

U.S. PATENT DOCUMENTS

| 4,806,883 | 2/1989 | Tamura et al. ............. 331/177 R X |
| 4,855,688 | 8/1989 | Douziech et al. ................... 331/8 |
| 4,975,662 | 12/1990 | Takeuchi ........................... 331/111 |

FOREIGN PATENT DOCUMENTS

| 106157 | 4/1984 | European Pat. Off. . |
| 312141 | 4/1989 | European Pat. Off. . |
| 3313868 | 11/1983 | Fed. Rep. of Germany . |
| 58-027440 | 5/1983 | Japan . |
| 61-125229 | 10/1986 | Japan . |

Primary Examiner—Siegfried H. Grimm
Attorney, Agent, or Firm—Edward D. Manzo

[57] ABSTRACT

A voltage-controled oscillator circuit generates an output signal with a frequency that varies in response to a control current regulated by an applied control voltage. The voltage-controlled oscillator also thresholds the control voltage according to two different threshold voltages, producing a thresholded signal with a hysteresis characteristic. The thresholded signal switches a constant-current circuit on and off. When switched on, the constant-current adds a fixed current to the control current, thus widening the frequency range of the output signal.

10 Claims, 2 Drawing Sheets

CURRENT CONTROLLED OSCILLATOR INCLUDING CONVERSION OF CONTROL VOLTAGE TO REGULAR AND THRESHOLDED CONTROL CURRENTS

BACKGROUND OF THE INVENTION

This invention relates to a voltage-controlled oscillator circuit used, for example, in a phase-locked loop (PLL) in a coding-decoding device (CODEC) in a digital telephone switching system.

A voltage-controlled oscillator produces an output signal $\phi$ having a frequency f that depends on an applied control voltage, the dependence being substantially linear. As the control voltage varies in a control range $V_c$, the frequency f varies in a corresponding frequency range $f_c$. In applications such as the one mentioned above, the purpose of the voltage-controlled oscillator circuit is to hold the frequency f constant at certain value $f_0$. The frequency range $f_c$ must therefore contain the value $f_0$.

The process of manufacturing a voltage-controlled oscillator, however, is attended by unavoidable variability, which leads to variations in capacitance values, transistor transconductance values, and other circuit parameters. These variations displace the frequency range $f_c$ by variable amounts in the upward or downward direction. The circuit designer is faced with the problem of ensuring that, despite such variations, the frequency range $f_c$ corresponding to the control range $V_c$ still includes the target frequency $f_0$.

A prior-art solution to this problem has been to widen the frequency range $f_c$ by increasing the voltage-to-frequency conversion gain. Unfortunately, this solution has undesirable side effects. In a PLL, for example, the increased gain widens the loop bandwidth, making the PLL susceptible to external noise effects and liable to jitter.

SUMMARY OF THE INVENTION

It is accordingly an object of the present invention to widen the frequency range of a voltage-controlled oscillator circuit without increasing its gain.

Another object is to avoid external noise effects and jitter when a voltage-controlled oscillator circuit is used in a PLL.

A voltage-controlled oscillator circuit comprises an oscillating circuit for generating an output signal with a frequency that varies in response to a control current, main current control means that receives an applied control voltage and regulates the control current accordingly, a thresholding circuit that also receives the applied control voltage, and a constant-current circuit controlled by the thresholding circuit.

The thresholding circuit has a first threshold voltage and a second threshold voltage, the first threshold voltage being higher than the second threshold voltage. The thresholding circuit produces a thresholded signal that enters a first state when the control voltage rises past the first threshold voltage, and enters a second state when the control falls below the second threshold voltage.

The thresholded signal switches the constant-current circuit on in the first state and off in the second state. When switched on, the constant-current varies the control current by adding a fixed current when switched on.

DETAILED DESCRIPTION OF THE INVENTION

A novel voltage-controlled oscillator circuit will be described with reference to the drawings, which depict an application in a PLL. This circuit is shown to illustrate the invention; it does not restrict the scope of the invention, which should be determined solely from the appended claims.

Figure 1:
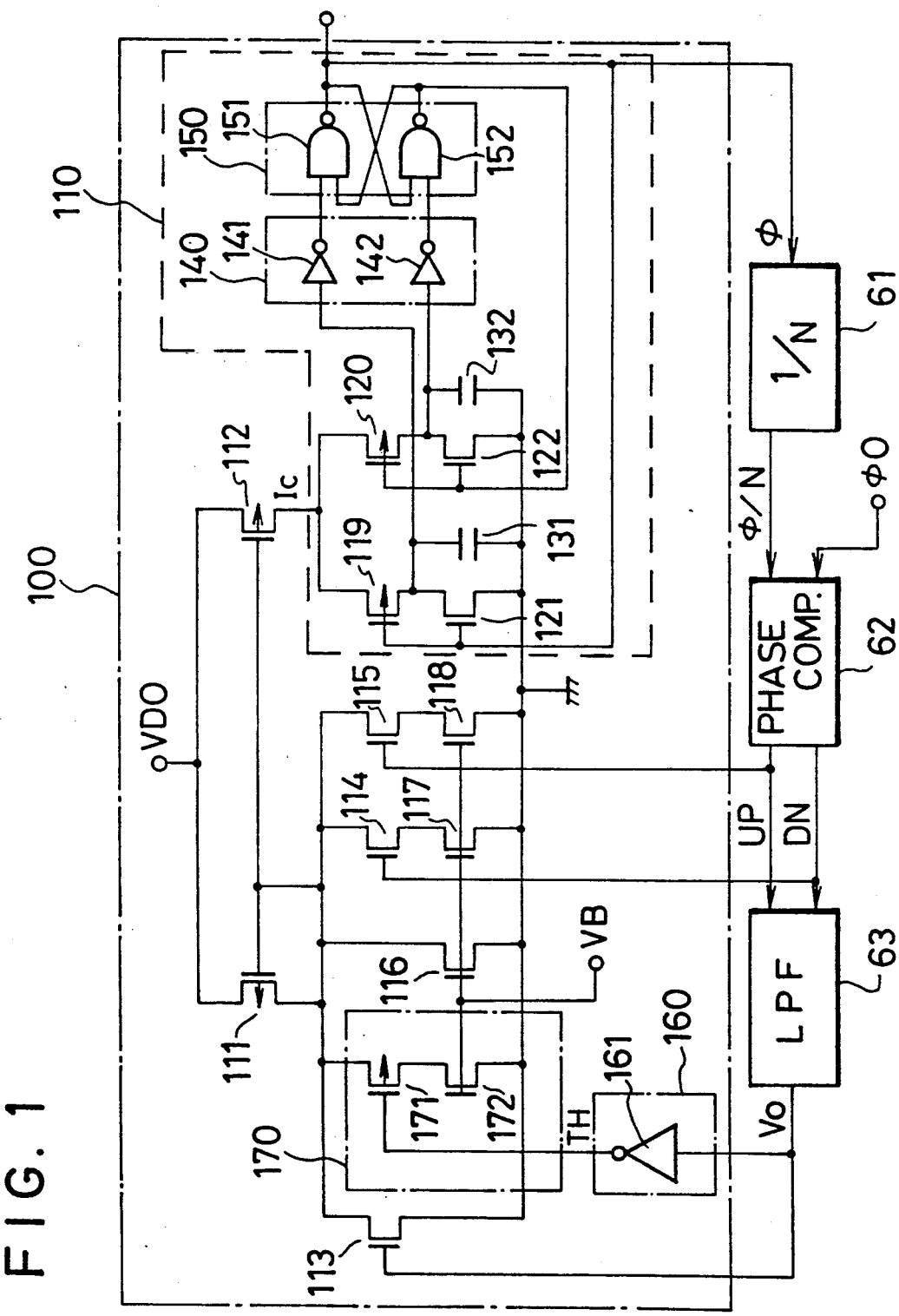
FIG. 1 is a circuit diagram of a PLL incorporating the invented voltage-controlled oscillator circuit.

The PLL in FIG. 1 comprises a divide-by-N circuit 61, a phase comparator 62, a low-pass filter (LPF) 63, and a voltage-controlled oscillator circuit 100 connected in a loop. The output signal $\phi$ of the voltage-controlled oscillator circuit 100 is furnished to external devices as the output signal $\phi$ of the PLL, and is also fed as input to the divide-by-N circuit 61. The divide-by-N circuit 61 is, for example, a modulo-N counter that produces a divided signal $\phi/N$ having 1/N the frequency of the signal $\phi$.

The divided signal $\phi/N$ and a reference-frequency signal $\phi 0$ are fed to the phase comparator 62, which compares their phases and produces two logic-level output signals UP and DN. When $\phi/N$ and $\phi 0$ match in phase, UP is low and DN is high. When $\phi/N$ lags $\phi 0$ in phase, UP and DN are both high. When $\phi/N$ leads $\phi 0$ in phase, UP and DN are both low. UP and DN are fed as inputs to the LPF 63, and are also input directly to the voltage-controlled oscillator circuit 100.

The LPF 63 is a well-known circuit that integrates a pair of currents switched on and off by the UP and DN input signals. The LPF 63 thereby produces a control voltage Vo that rises when UP and DN are both high, falls when UP and DN are both low, and holds substantially constant when UP is low and DN is high. The control voltage Vo is fed to the voltage-controlled oscillator circuit 100 to control the frequency of the output signal $\phi$.

The voltage-controlled oscillator circuit 100 comprises an oscillating circuit 110 for generating an oscillatory signal (the output signal $\phi$) having a frequency f that varies in response to an applied control current $I_c$. The other parts of the voltage-controlled oscillator circuit 100 form a control means for regulating the control current $I_c$ responsive to an applied control voltage (Vo). The main current control means comprises a pair of PMOS transistors 111 and 112 and an NMOS transistor 113.

In the following description of the voltage-controlled oscillator circuit 100, the terms source and drain will be used as follows. For each transistor, the word drain will designate the electrode at the top in the drawing, and the word source the electrode at the bottom.

The PMOS transistors 111 and 112 are interconnected in a mirror configuration; that is, their drains are both connected to the supply voltage VDD, and their gates are mutually interconnected. The control current $I_c$ is applied from the source of the PMOS transistor 112 to the oscillating circuit 110. Because of the mirror configuration, the control current $I_c$ matches the drain current of the PMOS transistor 111.

The gates of the PMOS transistors 111 and 112 are connected not only to each other but also to the source of the PMOS transistor 111 and the drain of the NMOS transistor 113. The source of the NMOS transistor 113 is connected to ground. The gate of the NMOS transistor 113 receives the control voltage Vo, which thus regulates the current flow through the NMOS transistor 113. When Vo rises this current flow increases, increasing the drain current of the PMOS transistor 111, hence increasing the control current $I_c$. Similarly, when Vo falls the control current $I_c$ decreases.

As auxiliary control means of regulating the control current $I_c$, the voltage-controlled oscillator circuit 100 also comprises NMOS transistors 114, 115, 116, 117, and 118. A constant bias voltage VB is applied to the gates of the NMOS transistors 116, 117, and 118. The sources of the NMOS transistors 116, 117, and 118 are all connected to ground.

The drain of the NMOS transistor 116 is connected to the source of the PMOS transistor 111. The NMOS transistor 116 thus adds a constant offset, determined by the bias voltage VB, to the drain current of the PMOS transistor 111, hence to the control current $I_c$.

The drain of the NMOS transistor 117 is connected to the source of the PMOS transistor 111 through the NMOS transistor 114, the gate of which receives the signal DN from the phase comparator 62. The NMOS transistor 117 thus adds a constant current, determined by VB, to the drain current of the PMOS transistor 111 when DN is high, this current being switched off when DN is low.

Similarly, the drain of the NMOS transistor 118 is connected to the source of the PMOS transistor 111 through the NMOS transistor 115, the gate of which receives the signal UP from the phase comparator 62. Thus UP and DN both increase the drain current of the PMOS transistor 111, hence the control current $I_c$, by constant amounts when driven active (high).

The oscillating circuit 110 comprises PMOS transistors 119 and 120, NMOS transistors 121 and 122, capacitors 131 and 132, a voltage-detecting circuit 140 comprising inverters 141 and 142, and a flip-flop 150 comprising NAND gates 151 and 152. The source of the PMOS transistor 112 is connected in common to the drains of the PMOS transistors 119 and 120. The source of the PMOS transistor 119 is connected in common to the drain of the NMOS transistor 121, one electrode of the capacitor 131, and the input terminal of the inverter 141. Similarly, the source of the PMOS transistor 120 is connected in common to the drain of the NMOS transistor 122, one electrode of the capacitor 132, and the input terminal of the inverter 142. The sources of the NMOS transistors 121 and 122 and the other electrodes of the capacitors 131 and 132 are grounded.

The output terminals of the inverters 141 and 142 are connected to input terminals of the NAND gates 151 and 152, respectively. The output of the NAND gate 151 is fed to the other input terminal of the NAND gate 152, and to the gates of the PMOS transistor 119 and the NMOS transistor 121. The output of the NAND gate 152 is fed to the other input terminal of the NAND gate 151, and to the gates of the PMOS transistor 120 and the NMOS transistor 122.

The oscillating circuit 110 alternates between two states. In the first state, the output of the NAND gate 152 is high and the capacitor 131 is initially discharged. Both inputs to the NAND gate 151 are thus high, hence the output of the NAND gate 151 is low. The low output from the NAND gate 151 switches the PMOS transistor 119 on and the NMOS transistor 121 off, so the capacitor 131 is charged by the control current $I_c$. The high output from the NAND gate 152 switches the PMOS transistor 120 off and the NMOS transistor 122 on, so the capacitor 132 discharges to ground.

When the capacitor 131 has charged to a voltage exceeding the threshold voltage of the inverter 141 and the capacitor 132 has discharged to a voltage less than the threshold voltage of the inverter 142, the second state is entered. In this state, the output of the inverter 141 is low, so the output of the NAND gate 151 goes high. The output of the inverter 142 is also high, so the output of the NAND gate 152 goes low. The high output from the NAND gate 151 switches the PMOS transistor 119 off and the NMOS transistor 121 on, so the capacitor 131 now discharges to ground. The low output from the NAND gate 152 switches the PMOS transistor 120 on and the NMOS transistor 122 off, so the capacitor 132 is now charged by the control current $I_c$.

When the capacitor 131 has discharged to a voltage less than the threshold voltage of the inverter 141 and the capacitor 132 has charged to a voltage exceeding the threshold voltage of the inverter 142, the circuit reverts from the second state to the first state. The circuit continues to oscillate between these two states, causing the output signal $\phi$ to oscillate between the high and low levels. The rate of oscillation, which is the frequency f of $\phi$, is set by rate at which the capacitors 131 and 132 charge, which is determined by the control current $I_c$.

The voltage-controlled oscillator circuit 100 also has a thresholding circuit 160 comprising an inverter 161. the inverter 161 receives the control voltage Vo from the LPF 63 and inverts it to a thresholded signal TH having two states: a first state in which TH is high, and a second state in which TH is low. The thresholding is performed according to two threshold values, Vlh and Vhl, of which Vlh is higher than Vhl. When Vo changes from a value less than Vlh to a value greater than Vlh, TH goes low. When Vo changes from a value greater than Vhl to a value less than Vhl, TH goes high.

Figure 2:
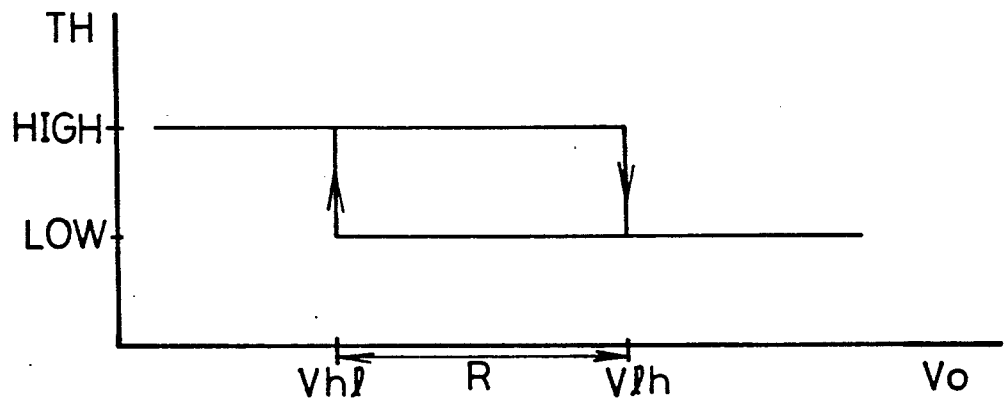
FIG. 2 is a graph illustrating the operation of the thresholding circuit in FIG. 1.

With reference to FIG. 2, the thresholding circuit 160 thus operates with a hysteresis characteristic: when Vo enters the region R between Vlh and Vhl from one side, the thresholded signal TH does not change until Vo leaves this region on the other side.

With reference again to FIG. 1, the voltage-controlled oscillator circuit 100 also has a constant-current circuit 170 comprising a PMOS transistor 171 connected in series with an NMOS transistor 172, the source of the NMOS transistor 172 being connected to the drain of the PMOS transistor 171. The drain of the PMOS transistor 171 is connected to the source of the PMOS transistor 111. The source of the NMOS transistor 172 is grounded.

The gate of the PMOS 171 transistor receives the thresholded signal TH from the thresholding circuit 160, so the PMOS 171 transistor switches on when TH is low and off when TH is high. The gate of the NMOS transistor 172 receives the bias voltage VB. The constant-current circuit 170 thus varies the drain current of the PMOS transistor 111, hence the control current $I_c$, by a constant amount according to the state of the thresholded signal TH. Specifically, a constant amount is added to $I_c$ when TH is in the low state.

All the circuit elements shown in FIG. 1 can be integrated onto a semiconductor substrate by a well-known complementary MOS (CMOS) fabrication process. The invention is not restricted to use in CMOS integrated circuits, however; it can be applied in other types of circuits as well.

The operation of the PLL in FIG. 1 can be generally described as follows. Suppose that the divided signal $\phi/N$ and the reference-frequency signal $\phi 0$ are initially in phase, so that UP is low and DN is high, but that $\phi/N$ has a slightly lower frequency than $\phi 0$. Soon $\phi/N$ will begin to lag $\phi 0$ in phase, at which point UP will go high, abruptly increasing the control current $I_c$ in the voltage-controlled oscillator circuit 100 and raising the frequency f of $\phi$. Since UP and DN are now both high, the control voltage Vo also rises, increasing the output frequency f still further.

When $\phi/N$ catches up with $\phi 0$ in phase, UP goes low, DN remains high, and Vo holds steady at a new value higher than its previous value. The output frequency f of $\phi$ drops abruptly because UP has switched from high to low, then remains substantially constant at the new value determined by Vo. If the corresponding new frequency of $\phi/N$ matches the frequency of $\phi 0$, the circuit remains in this state.

Similarly, when $\phi/N$ leads $\phi 0$ in phase, UP and DN both go low and Vo falls, adjusting the output signal $\phi$ backward in phase and downward in frequency. The overall effect is to lock $\phi$ in phase with $\phi 0$ at a frequency equal to N times the frequency of $\phi 0$.

Next, the operation of the voltage-controlled oscillator circuit 100 in FIG. 1 will be described. As has already been explained, the oscillating circuit 110 produces an output signal $\phi$ having a frequency f that varies in response to the control current $I_c$, which matches the drain current of the PMOS transistor 111. The drain current of the PMOS transistor 111 is the sum of the drain currents of the NMOS transistors 113, 116, 117, 118, and 172. The manner in which the drain currents of the NMOS transistors 113, 117, and 118 are controlled by the signals Vo, DN, and UP has already been explained, and the drain current of the NMOS transistor 116 is constant, so all that remains is to explain the operation of the drain current flowing through the NMOS transistor 172. This will be done with reference to FIG. 3.

Figure 3:
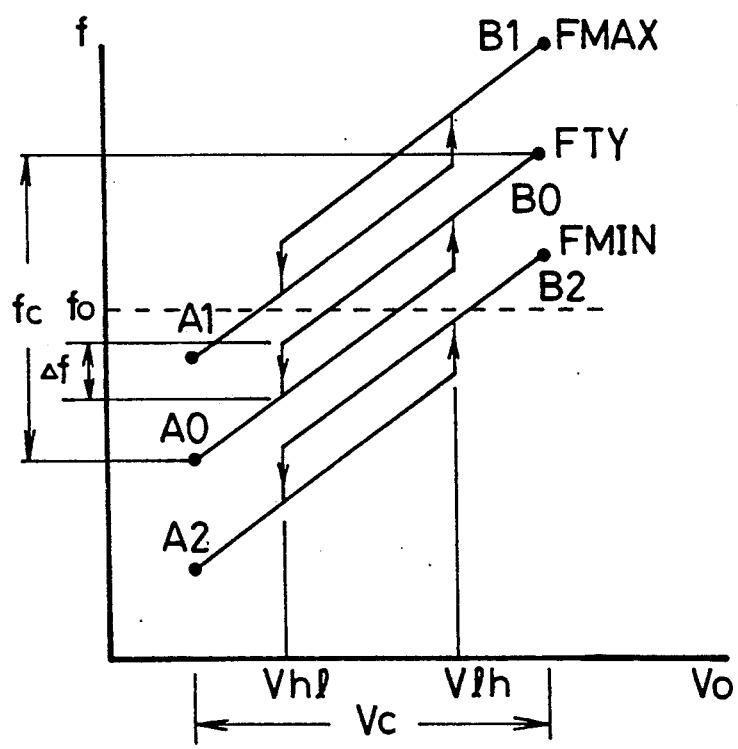
FIG. 3 is a voltage-frequency graph illustrating the operation of the voltage-controlled oscillator circuit in FIG. 1.

FIG. 3 illustrates the voltage-frequency characteristic of the voltage-controlled oscillator 100 in FIG. 1. The horizontal axis represents the control voltage Vo. $V_c$ is the control range: the range of voltages produced by the LPF 63. The threshold voltages Vhl and Vlh of the inverter 161 are located within this range. The vertical axis represents the frequency f of the output signal $\phi$. The target frequency fo is indicated by a dashed line. For simplicity only the response of the frequency f to the control voltage Vo is considered; the effects of UP and DN are not shown.

FTY designates the voltage-frequency characteristic of a typical voltage-controlled oscillator 100 produced by the manufacturing process. When Vo is at the extreme lower end of the control range $V_c$ (the left end in FIG. 3), the frequency f is at the extreme lower end of the frequecny range $f_c$ and the circuit operates at the point labeled A0. As Vo rises, so does f, following the line sloping up from A0. When Vo reaches Vlh, the PMOS transistor 171 in FIG. 1 switches on, allowing additional current to flow through the NMOS transistor 172, and the frequency f abruptly rises. Thereafter, as Vo rises from Vlh to the extreme upper end of the control range $V_c$ (the right end in FIG. 3), f increases along the line terminating at the point B0.

As Vo falls from the upper end of the control range $V_c$, f decreases along the line sloping down from B0. When Vo reaches Vhl, the PMOS transistor 171 cuts off and f abruptly drops, continuing thereafter on the line leading back to A0. The hysteresis of the thresholding circuit 160 illustrated in FIG. 2 thus creates a hysteresis in the voltage-frequency characteristic illustrated in FIG. 3.

The effect of this hysteresis is to widen the frequency range $f_c$ corresponding to the control range $V_c$ by the amount $\Delta f$ in FIG. 3. As a result, even if variations in the manufacturing process shift the voltage-frequency characteristic upward to the characteristic denoted FMAX or downward to the characteristic denoted FMIN, the dashed line $f_o$ still intersects the characteristic well within the control range $V_c$, enabling the frequency f of the output signal $\phi$ to be locked at $f_o$ as desired.

The widening of the frequency range $f_c$ is moreover achieved without increasing the voltage-frequency gain; that is, without increasing the slope of the lines terminating at A0 and B0, or at A1 and B1, or at A2 and B2. The problems of the prior art, such as increased susceptibility to external noise and jitter, are therefore avoided.

The circuit shown in FIG. 1 can be modified in various ways, which will be obvious to one skilled in the art, without departing from the spirit and scope of the present invention. Such modifications include, but are not limited to, the following:

The thresholding circuit 160 in FIG. 1 can comprise a comparator with a hysteresis characteristic, instead of the inverter 161.

In the constant-current circuit 170 in FIG. 1, the current-driving PMOS transistor 171 can be connected between the source of the constant-current NMOS transistor 172 and ground. The roles the PMOS and NMOS transistors can furthermore be reversed; that is, the NMOS transistor can receive the threshold signal TH at its gate electrode while the PMOS transistor receives the bias voltage VB. The constant-current circuit 170 can also be structured using other circuit elements such as bipolar transistors.

The other parts of the voltage-controlled oscillator 100 in FIG. 1 can be structured using other transistors, such as bipolar transistors, or other gate circuits, such as NOR gates.

The general PLL configuration can be modified in various ways, and the voltage-controlled oscillator circuit 100 can be applied in circuits other than a PLL.

What is claimed is:

1. A voltage-controlled oscillator circuit, comprising:
    an oscillating circuit for generating an oscillatory output signal with a frequency that varies responsive to an applied control current;
    main current control means for regulating said control current responsive to an applied control voltage;
    a thresholding circuit with a first threshold voltage and a second threshold voltage, said first threshold voltage being higher than said second threshold voltage, for receiving said control voltage and producing a thresholded signal having two states, a first state entered when said control voltage rises past said first threshold voltage and a second state entered when said control voltage falls below said second threshold voltage; and a constant-current circuit switched on and off by said thresholded signal, for varying said control current by adding a fixed current thereto.

2. The circuit of claim 1, wherein said thresholding circuit comprises an inverter.

3. The circuit of claim 1, wherein said constant-current circuit is switched on when said thresholded signal is in said first state and off when said thresholded signal is in said second state.

4. The circuit of claim 1, wherein said constant-current circuit comprises:

a first transistor switched on and off by said thresholded signal; and a second transistor connected in series with said first transistor.

5. The circuit of claim 4, wherein said first transistor is a PMOS transistor having a gate electrode to which said thresholded signal is applied.

6. The circuit of claim 5, wherein said second transistor is an NMOS transistor having a gate electrode to which a constant bias voltage is applied.

7. The circuit of claim 1, also comprising auxiliary control means for varying said control current in response to signals that control said control voltage.

8. A method of controlling a voltage controlled oscillator circuit comprising the steps of:

providing a control voltage;

processing said control voltage in a hysteresis circuit so that in response to said control voltage rising past an upper threshold voltage, a first state is entered, and in response to said control voltage falling below a lower threshold voltage, the first state is departed; and modulating the oscillating frequency of the oscillator circuit in accordance with whether the circuit is in the first state.

9. The method of claim 8 wherein the method further comprises providing a current signal to an oscillating circuit within the voltage controlled oscillator; and modulating the current signal in accordance with whether the circuit is in the first state.

10. The method according to claim 8 wherein the oscillator circuit is controlled to provide an output having a frequency response over a voltage control range, the frequency response having abrupt transitions at said upper and lower threshold voltages so that as the control voltage rises and exceeds the upper threshold voltage, the frequency output of the oscillator abruptly rises, and when the control voltage decreases, an abrupt frequency change occurs as the control voltage drops below the lower threshold voltage.

* * * * *